(12) United States Patent
Lo

(10) Patent No.: US 6,729,384 B1
(45) Date of Patent: May 4, 2004

(54) COOLING FIN ASSEMBLY

(75) Inventor: Ruei-An Lo, Taipei (TW)

(73) Assignee: Hsiang Kang Enterprises Co., Ltd., Taipei Hsien (TW)

( * ) Notice: Subject to any disclaimer, the term of this patent is extended or adjusted under 35 U.S.C. 154(b) by 0 days.

(21) Appl. No.: 10/455,312

(22) Filed: Jun. 6, 2003

(51) Int. Cl.⁷ .................................................. F28F 7/00
(52) U.S. Cl. ...................... 165/80.3; 165/185; 361/697; 361/704; 174/16.3; 257/722
(58) Field of Search ................................ 165/80.3, 185; 361/697, 704, 710; 257/706, 722; 174/16.3

(56) References Cited

U.S. PATENT DOCUMENTS

| | | | | |
|---|---|---|---|---|
| 6,340,056 B1 * | 1/2002 | Huang et al. | ................ | 165/185 |
| 6,386,275 B1 * | 5/2002 | Kuo et al. | ................. | 165/80.3 |
| 6,449,160 B1 * | 9/2002 | Tsai | ........................ | 361/709 |
| 6,474,407 B1 * | 11/2002 | Chang et al. | ............. | 165/80.3 |
| 6,607,023 B2 * | 8/2003 | Ho et al. | ....................... | 165/78 |
| 6,607,028 B1 * | 8/2003 | Wang et al. | ................ | 165/185 |
| 6,619,381 B1 * | 9/2003 | Lee | ............................... | 165/78 |
| 6,639,802 B1 * | 10/2003 | Dong et al. | ................. | 361/709 |
| 6,644,386 B1 * | 11/2003 | Hsu | .......................... | 165/80.3 |
| 6,644,397 B1 * | 11/2003 | Shen | ......................... | 165/185 |
| 6,655,448 B1 * | 12/2003 | Lin | ........................... | 165/80.3 |

* cited by examiner

Primary Examiner—Terrell L. McKinnon

(57) ABSTRACT

A cooling fin assembly according to the invention includes a plurality of cooling fins joined with one another for forming a plurality of vertical and parallel cooling fins mounted on a base of a heat sink. Wherein, two sides at a bottom portion of a main body of each cooling fin are provided with a clasp piece, respectively, a bottom edge of the main body is transversely extended and formed with a connecting piece, and an edge of the connecting piece is further formed with a positioning piece by folding upward. When a second cooling fin is butted against a side edge of the positioning piece of a second cooling fin, the clasp piece of the second cooling fin is clasped at the positioning piece of the first cooling fin, thereby fastening and joining the cooling fins to one another.

4 Claims, 5 Drawing Sheets

COOLING FIN ASSEMBLY

BACKGROUND OF THE INVENTION (a) Field of the Invention

The invention relates to a cooling fin assembly, and more particularly, to a cooling fin assembly suitable for heat sinks used in various chipsets or processors of computers. The cooling fins are fastened and joined with one another using structures thereof, thereby economizing production cost thereof.

(b) Description of the Prior Art

It is widely acknowledged that heat is produced during operations of chipsets or processors of computers. The faster the operation speed is, the larger the watt of the driving power gets, and the higher the temperature produced becomes. However, excessive high temperatures of the chipsets or processors are likely to affect operations thereof, and computer crashes are thus frequently resulted. Therefore, heat sinks are provided at the chipsets or processors for heat dissipation.

In a structure of a common heat sink, a top plane of a base made of aluminum and mounted on a chipset or processor is extended upward so as to form a plurality of vertical, parallel and spaced cooling fins. Heat produced by the chipset or processor is absorbed by the base and transmitted to the plurality of cooling fins. Heat exchange is carried out using spaces between individual cooling fins, and thus accomplishing heat dissipation purposes. In addition, certain heat sinks are provided with fans above. Wind blowing from the fans is utilized to accelerate speed of air traveling between individual cooling fins, so as to spontaneously speed up heat dissipation for further lowering temperature of the chipset or processor. It is to be noted that heat sinks having additional fans are within applicable range of the invention.

An extensively applied manufacturing method of the aforesaid cooling fin is aluminum extrusion. After having been formed by aluminum extrusion, the cooling fin is sliced and processed to an appropriate dimension for coordinating with chipsets or processors. However, such type of cooling fin formed by aluminum extrusion has several drawbacks. Production cost thereof is rather high due to slow manufacturing speed thereof. Also, to avoid breakage of molds caused by pressure during extrusion and subsequent quantity restrictions on cooling fins, spaces between individual cooling fins shall not be too small either. However, the fewer the quantity of cooling fins is, the smaller the available area for heat dissipation gets, and the slower the heat dissipation speed becomes. In addition, molds are needed for heat sinks formed by aluminum extrusion. Once the molds are completed, difficulties may arise if any changes are required, and hence restricting dimensions of the heat sinks formed by aluminum extrusion.

The aforesaid drawbacks of conventional heat sinks formed by aluminum extrusion have become more and more incompetent in solving heat dissipation problems of advanced chipsets and processors having faster and faster operation speeds today. Therefore, to solve the aforesaid drawbacks of the prior art, industrialists have developed a cooling fin assembly having a plurality of cooling fins that are manufactured independently and then assembled.

Referring to FIG. 1, in a prior art, a plurality of cooling fins are independently manufactured, and then assembled. Each main body of the cooling fins 1 is stamped into a thin slice in shape. Upper and lower edges of the main body 1 are transversely extended to form upper and lower joining pieces 2. The upper and lower joining pieces 2 are further stamped to form a plurality of corresponding positioning holes 3 and positioning bumps 4.

During assembly, two cooling fin main bodies 1 are placed next to each other. The upper and lower joining pieces 2 of one main body 1 is overlapped with another main body 1, such that the positioning bumps 4 thereof are fastened into the positioning holes 3 at the upper and lower joining pieces 2 of another main body 1, thereby completing the assembly process. Similarly, other cooling fin main bodies 1 are joined in sequence, and thus completing the assembly of a plurality of cooling fins.

The aforesaid technique, in which a plurality of cooling fins is manufactured independently, and assembled, is indeed capable of solving heat dissipation problems of heat sinks formed by aluminum extrusion. However, advancement thereof can yet be made. For instance, the upper joining piece 2 of the cooling fin main body 1 directly blocks an upper portion of the entire heat sink. After heat is absorbed by the heat sink, circulation paths of heat is hindered by the upper joining piece 2 when heat is ascended from thermal exchange of the cooling fin and air. As a result, speed of heat dissipation is relatively slowed down.

It is apparent that this prior art can be further advanced.

SUMMARY OF THE INVENTION

The object of the invention is to provide a cooling fin assembly comprising a plurality of cooling fins that form a plurality of vertical and parallel cooling fins above a base of a heat sink. Wherein, two sides at a bottom portion of a main body of each cooling fin are provided with a clasp piece, respectively; a bottom edge of the main body is transversely extended and formed with a connecting piece; and an edge of the connecting piece is further formed with a positioning piece by folding upward. Using the aforesaid structure, when a second cooling fin is butted against a side edge of the positioning piece of a first cooling fin, the clasp piece of the second cooling fin is clasped at the positioning piece of the first cooling fin, thereby fastening and joining the cooling fins to one another.

In the aforesaid cooling fin assembly according to the invention, positioning and fastening of two cooling fins are completed by a clasp piece of one cooling fin clasping a positioning piece of another cooling fin, and therefore two adjacent cooling fins are reserved with a certain gap in between while upper portions thereof in communication with open air of an exterior. For this reason, when heat below the plurality of cooling fins is absorbed and transmitted upward for thermal exchange with air, heat is rapidly ascended without hindrance, thereby increasing efficiencies of heat dissipation.

In addition, using structure of each cooling fin capable of joining and fastening with one another, molds formed by extrusion for heat sinks are no longer required. Manufacturing speed thereof is accelerated, and quantities of cooling fins may also be adjusted based on requirements. Therefore, dimensions of heat sinks are not restricted for further economizing production cost thereof.

Furthermore, the connecting piece and the positioning piece formed by transversely extending the bottom edge of each cooling fin enable the cooling fin to be joined with another cooling fin. The narrower the width of the connecting piece is, the smaller the space between two adjacent connecting pieces gets, and the larger the area for heat dissipation becomes. Consequently, the speed and efficiencies of heat dissipation are also relatively increased.

DETAILED DESCRIPTION OF THE PREFERRED EMBODIMENTS

To better understand the invention, detailed descriptions shall be given with the accompanying drawings below.

Figure 1:
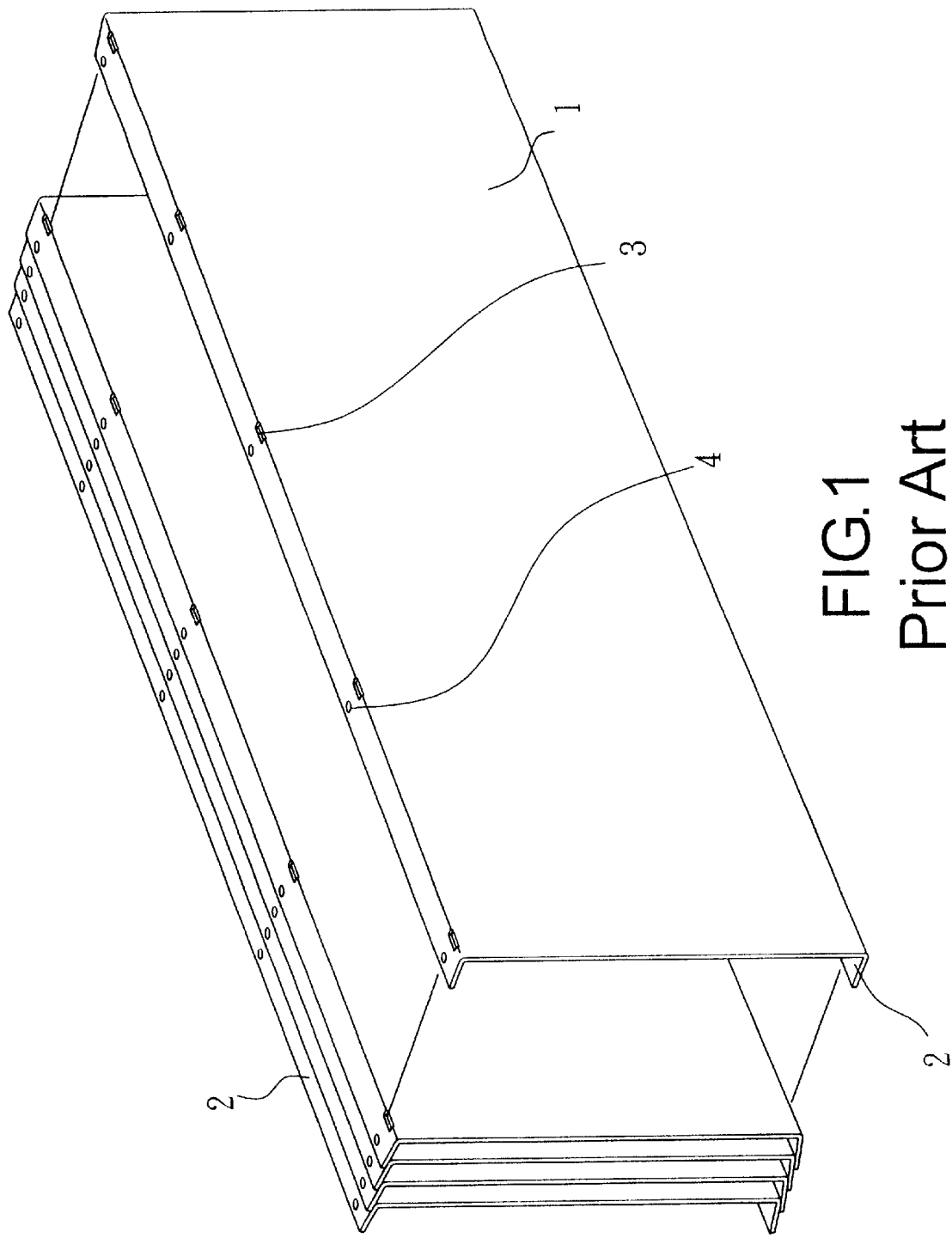
FIG. 1 shows a conventional schematic view illustrating a plurality of cooling fins first being manufactured independently and then assembled in a prior art.
Figure 2:
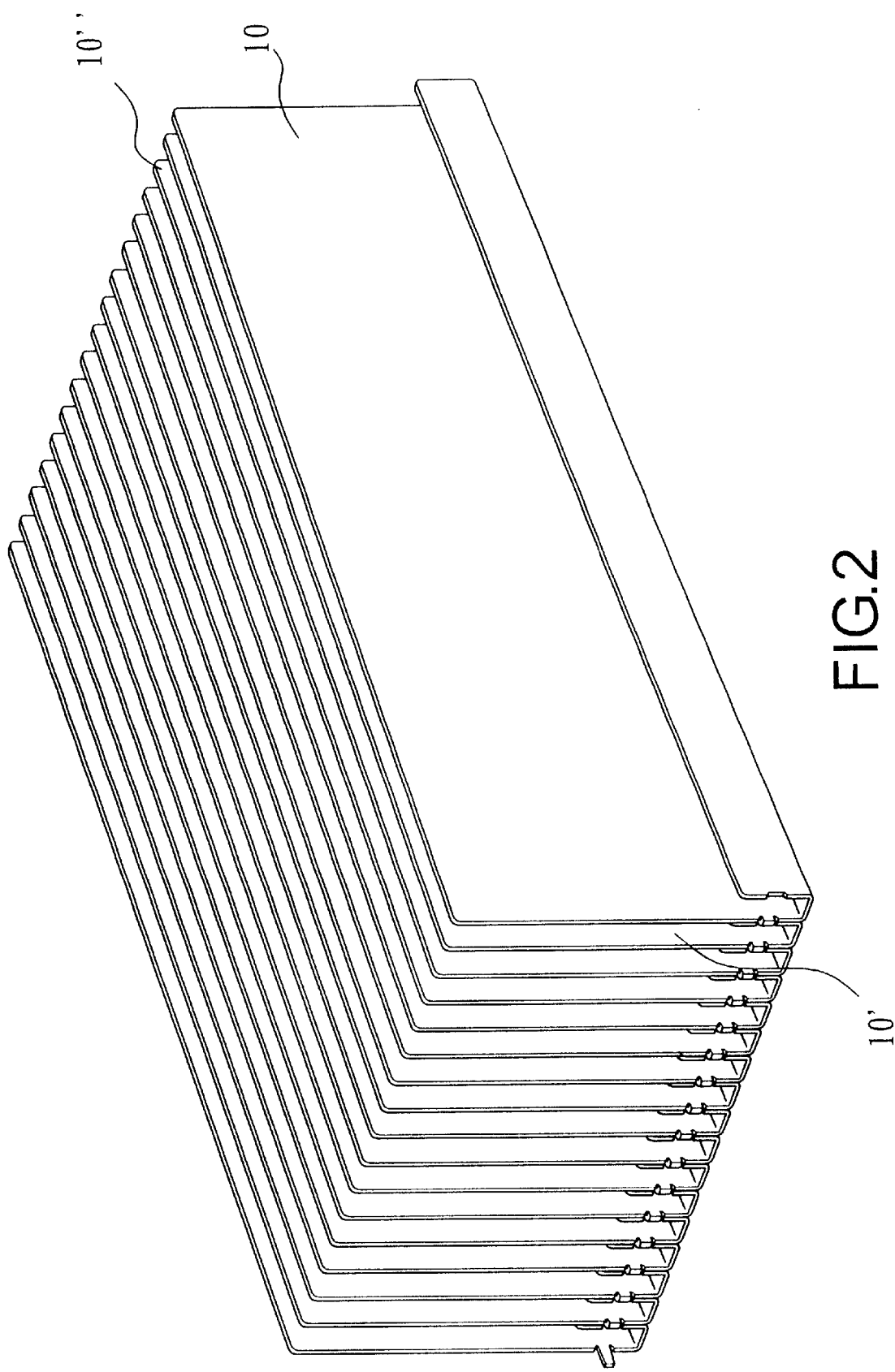
FIG. 2 shows a structural elevational view of the cooling fin assembly according to the invention.

Referring to FIG. 2, a cooling fin assembly according to the invention 10 suitable for heat sinks in various computer chipsets or processors, comprises a plurality of cooling fins 10, 10', 10", and so on, joined with one another, so as to form a plurality of vertical and parallel cooling fins 10, 10', 10", and so on, on a heat sink base (not shown in the diagram).

Figure 3:
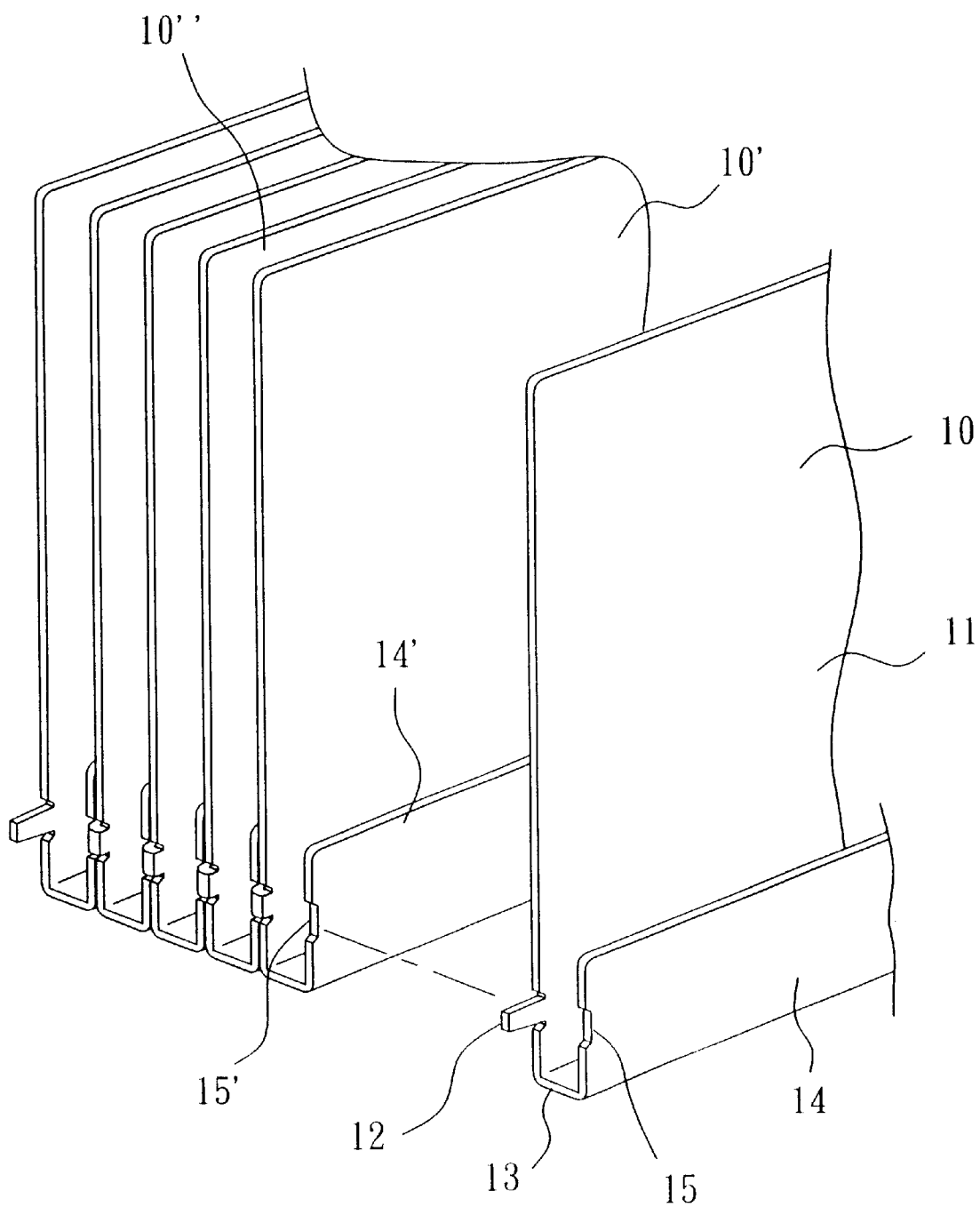
FIG. 3 shows an enlarged exploded partial schematic view of the cooling fin assembly according to the invention.

Referring to FIG. 3, in the plurality of cooling fins 10, 10', 10", and so on, two sides of a bottom portion of each cooling fin main body 11 are extended and formed with a clasp piece 12, respectively, and a bottom edge of the main body 11 is transversely extended and formed with a connecting piece 13. An edge of the connecting piece 13 is further formed with a positioning piece 15 by folding upward.

When the main body 11 of a first cooling fin 10 is butted against an edge of the positioning piece 14' of a second cooling fin 10', the clasp piece 12 at the bottom portion of the first cooling fin 10 is exactly corresponded with the positioning piece 14' of the second cooling fin 10'.

Figure 4:
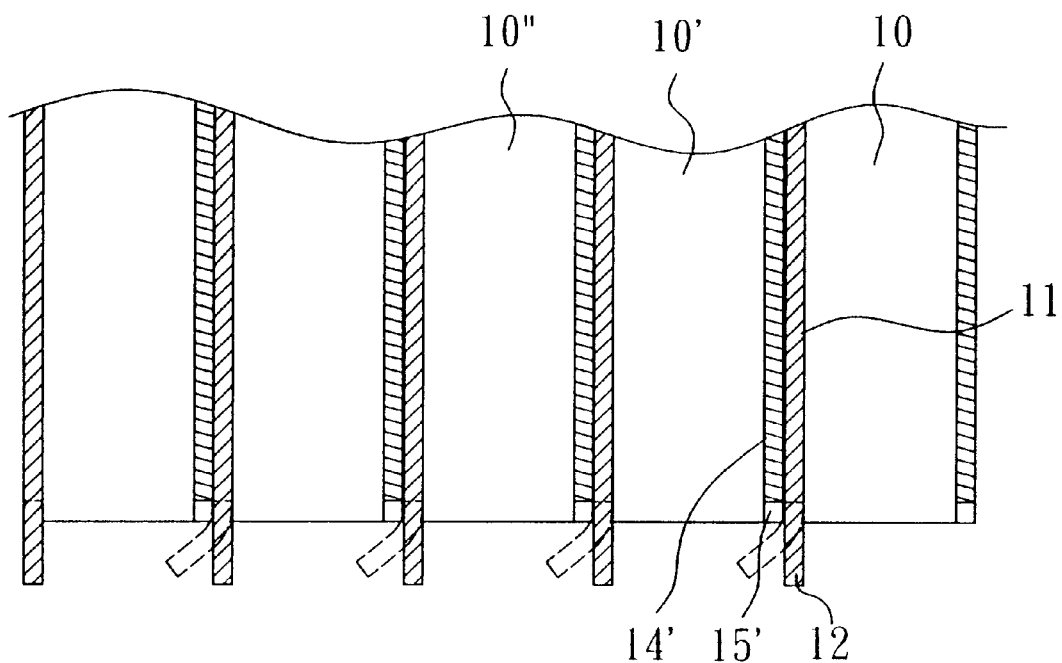
FIG. 4 shows a side schematic view illustrating a plurality of cooling fins being assembled according to the invention.
Figure 5:
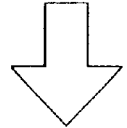
FIG. 5 shows a side view illustrating a plurality of cooling fins being assembled according to the invention.
Figure 5:
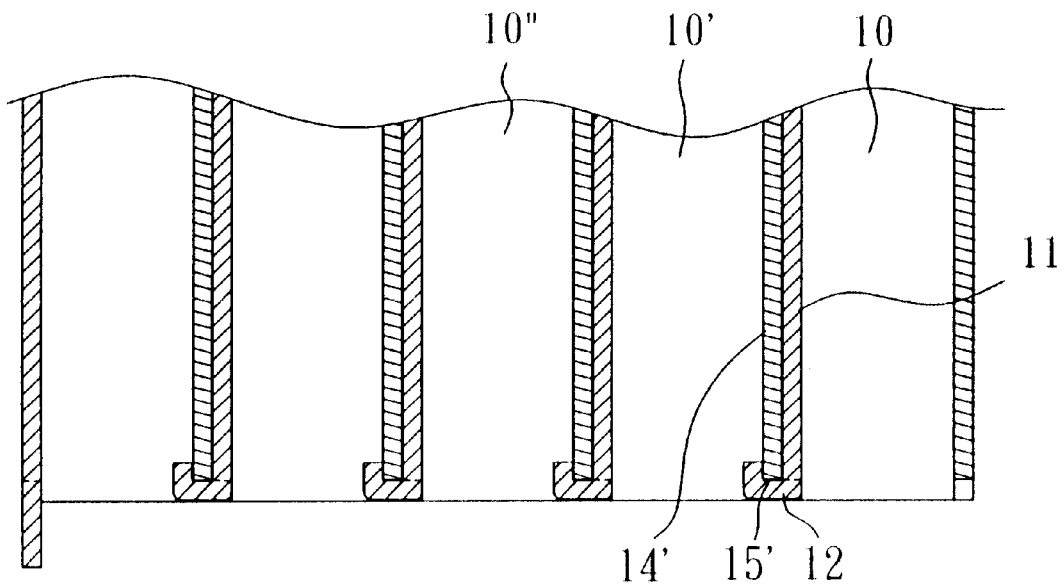

Referring to FIGS. 4 and 5, when the clasp piece 12 at the bottom portion of the first cooling fin 10 is exactly corresponded with the positioning piece 14' of the second cooling fin 10', the clasp piece 12 of the first cooling fin 10 is folded toward the positioning piece 14' of the second cooling fin 10', such that the clasp piece 12 of the first cooling fin 10 is clasped at the positioning piece 14' of the second cooling fin 10', thereby joining the first cooling fin 10 with the second cooling fin 10'.

Referring to FIGS. 2 to 5, using the similar method of joining the first cooling fin 10 to the second cooling fin 10' by clasping the clasp piece 12 of the first cooling fin 10 to the positioning piece 14' of the second cooling fin 10', other cooling fins 10" and so on may be joined in sequence, thereby completing the assembly of the plurality of cooling fins 10, 10', 10", and so on, and accomplishing the aforesaid objects and functions.

In an embodiment according to the invention, at the positioning piece 14 of individual cooling fins 10, 10', 10", and so on, a notch 15 is also excavated at a position corresponding to the clasp piece 12. When the main body 11 of the first cooling fin 10 is butted against the side edge of the positioning piece 14' of the second cooling fin 10', the clasp piece 12 at the bottom portion of the first cooling fin 10 is exactly positioned and corresponded with the notch 15' at the positioning piece 14' of the second cooling fin 10'. The clasp piece 12 may then be fastened to the notch 15, and so binding strength of the first cooling fin 10 and the second cooling 10' is reinforced.

Figure 6:
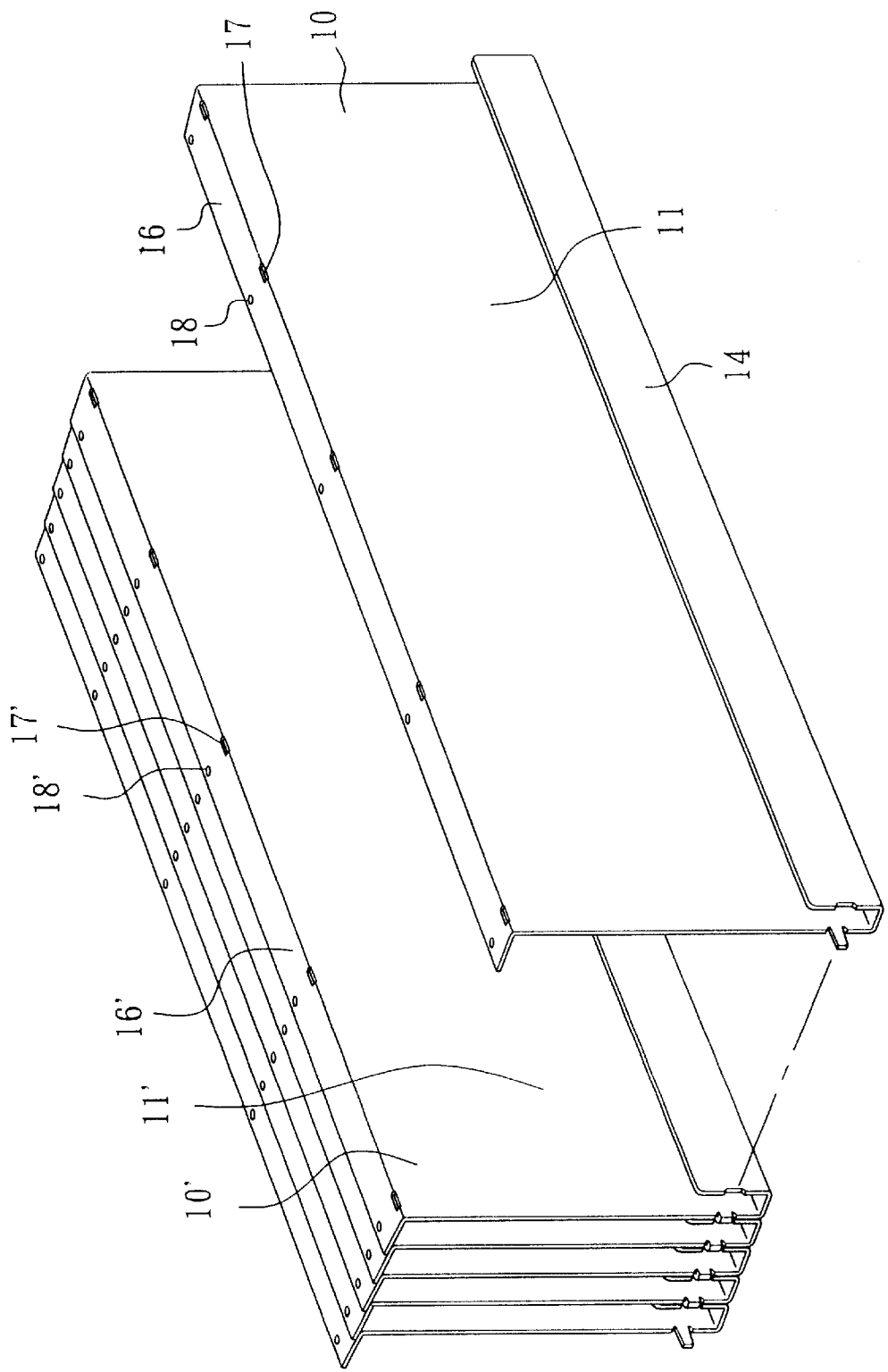
FIG. 6 shows an embodiment according to the invention.

Referring to FIG. 6 showing an embodiment according to the invention, similar to the prior art, an upper portion of each cooling fin 10 is disposed with a joining piece 16. The joining piece 16 is further stamped to form a plurality of corresponding positioning holes 17 and positioning bumps 18. When joining the plurality of cooling fins 10 with one another, one of the joining pieces 16 is joined with another joining piece 16', and the assembly is completed by fastening the positioning bumps 18 of the joining piece 16 to the positioning holes 17' of the joining piece 16'. However, due to blockage at upper portions of spaces between the plurality of the cooling fins 10 by the joining pieces 16, this embodiment is only applicable to heat sinks having additional fans for forced heat dissipation.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. A cooling fin assembly comprising a plurality of cooling fins joined with one another for forming a plurality of vertical and parallel cooling fins mounted on a base of a heat sink; wherein two sides at a bottom portion of a main body of each cooling fin are provided with a clasp piece, respectively, a bottom edge of the main body is transversely extended and formed with a connecting piece, an edge of the connecting piece is further formed with a positioning piece by folding upward, and when a second cooling fin is butted against a side edge of the positioning piece of a second cooling fin, the clasp piece of the second cooling fin is clasped at the positioning piece of the first cooling fin, thereby fastening and joining the cooling fins to one another.

2. The cooling fin assembly in accordance with claim 1, wherein at the positioning piece of each cooling fin, a notch is excavated at a position corresponding to the clasp piece, thereby clasping the clasp piece to an adjacent notch.

3. The cooling fin assembly in accordance with claim 1, wherein an upper edge of each cooling fin is disposed with a joining piece for joining and fastening to another cooling fin.

4. The cooling fin assembly in accordance with claim 3, wherein the joining piece are disposed with a plurality of corresponding positioning holes and positioning bumps.

* * * * *